(12) United States Patent
VanDerVeen et al.

(10) Patent No.: US 11,758,791 B2
(45) Date of Patent: Sep. 12, 2023

(54) NON-LIGHT-EMITTING VARIABLE TRANSMISSION DEVICE AND A LIGHT-EMITTING DEVICE ASSEMBLY AND A METHOD OF USING THE SAME

(71) Applicant: SAGE ELECTROCHROMICS, INC., Faribault, MN (US)

(72) Inventors: Cody VanDerVeen, Faribault, MN (US); Jean-Christophe Giron, Edina, MN (US); Robert J. Anglemier, Waterville, MN (US)

(73) Assignee: SAGE ELECTROCHROMICS, INC., Faribault, MN (US)

( * ) Notice: Subject to any disclaimer, the term of this patent is extended or adjusted under 35 U.S.C. 154(b) by 167 days.

(21) Appl. No.: 17/081,542

(22) Filed: Oct. 27, 2020

(65) Prior Publication Data

US 2021/0126063 A1 Apr. 29, 2021

Related U.S. Application Data

(60) Provisional application No. 62/926,903, filed on Oct. 28, 2019.

(51) Int. Cl.
*G02F 1/157* (2006.01)
*H10K 59/50* (2023.01)

(52) U.S. Cl.
CPC ............ *H10K 59/50* (2023.02); *G02F 1/157* (2013.01); *G02F 2201/44* (2013.01)

(58) Field of Classification Search
CPC ....... G09G 3/38; G02F 1/157; H01L 27/3232; E06B 3/6722
See application file for complete search history.

(56) References Cited

U.S. PATENT DOCUMENTS

| | | | |
|---|---|---|---|
| 5,416,617 A | 5/1995 | Loiseaux et al. |
| 5,532,869 A | 7/1996 | Goldner et al. |
| 6,700,692 B2 | 3/2004 | Tonar et al. |
| 9,499,103 B2 | 11/2016 | Han |
| 9,772,538 B2 | 9/2017 | Shi |
| 9,778,534 B2 | 10/2017 | Tran et al. |
| 9,939,704 B2 | 4/2018 | Patterson et al. |
| 10,096,533 B2 | 10/2018 | Jain et al. |
| 10,254,616 B2 | 4/2019 | Lam et al. |
| 10,331,003 B2 | 6/2019 | Holt et al. |
| 11,231,633 B2 | 1/2022 | Trikha et al. |

(Continued)

FOREIGN PATENT DOCUMENTS

| | | |
|---|---|---|
| KR | 101480948 B1 | 1/2015 |
| WO | 2018200702 A1 | 11/2018 |

OTHER PUBLICATIONS

International Search Report and Written Opinion for PCT/US2020/057469, dated Jan. 29, 2021, 12 pages.

*Primary Examiner* — Kevin M Nguyen
(74) *Attorney, Agent, or Firm* — Abel Schillinger, LLP; Robert N Young

(57) ABSTRACT

An assembly can include a first substrate, a second substrate, a non-light-emitting, variable transmission device deposited on the first substrate, and a transparent light-emitting device deposited on the second substrate, where the non-light-emitting, variable transmission device faces the transparent light-emitting device, and where the non-light emitting device alters an intensity of a wavelength prior to reaching the transparent light-emitting device.

19 Claims, 6 Drawing Sheets

(56) References Cited

U.S. PATENT DOCUMENTS

Figure 1:
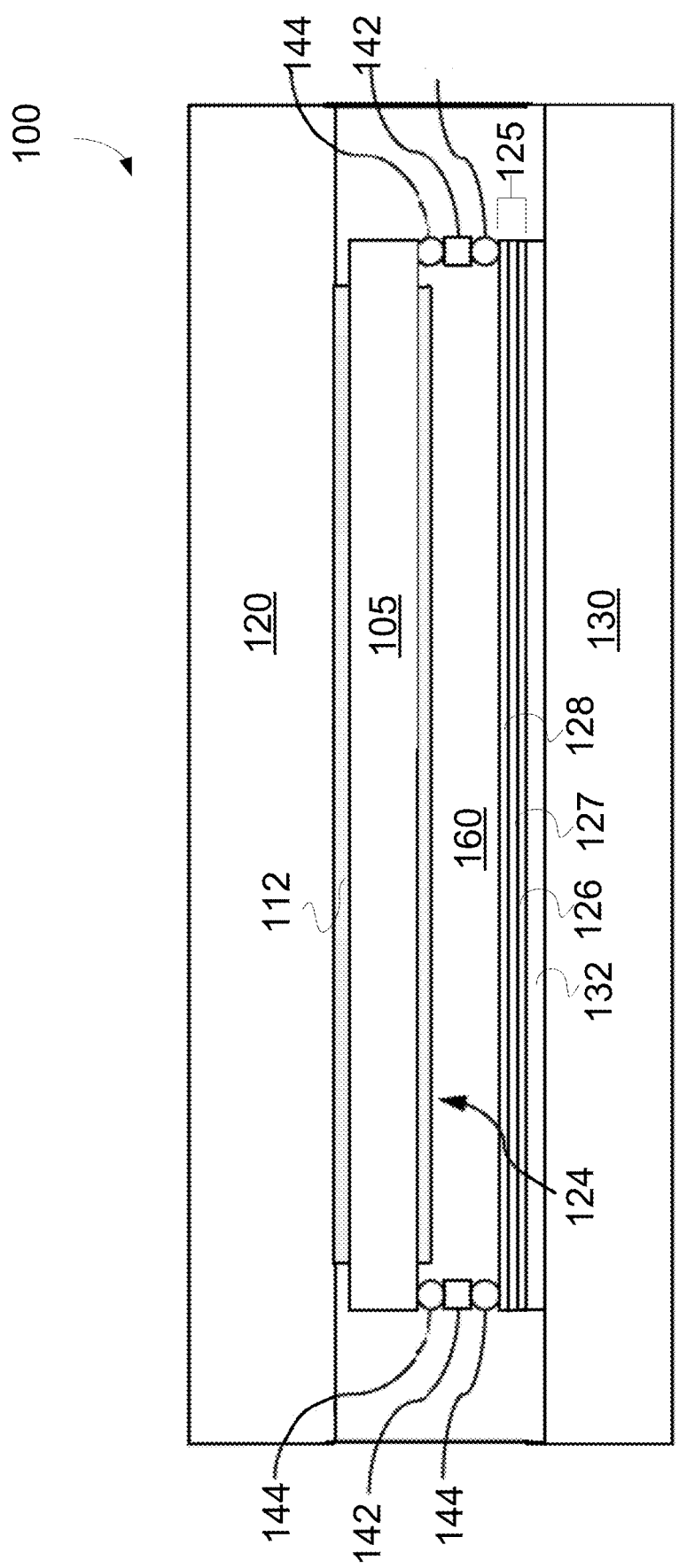

| | | |
|---|---|---|
| 11,454,854 B2 | 9/2022 | Trikha et al. |
| 11,467,464 B2 | 10/2022 | Trikha et al. |
| 11,493,819 B2 | 11/2022 | Trikha et al. |
| 11,513,412 B2 | 11/2022 | Trikha et al. |
| 2010/0082081 A1 | 4/2010 | Niessen et al. |
| 2012/0120643 A1 | 5/2012 | Meng et al. |
| 2014/0085913 A1 | 3/2014 | Han |
| 2014/0320782 A1 | 10/2014 | Uhm et al. |
| 2015/0236082 A1 | 8/2015 | Wang et al. |
| 2016/0225832 A1* | 8/2016 | Kwon ................... G02F 1/155 |
| 2017/0212399 A1 | 7/2017 | Tarng et al. |
| 2017/0355901 A1 | 12/2017 | Branda et al. |
| 2018/0154615 A1 | 6/2018 | Dohn et al. |
| 2018/0364541 A1 | 12/2018 | Turner et al. |
| 2019/0010751 A1 | 1/2019 | Mazuir et al. |
| 2020/0057421 A1* | 2/2020 | Trikha ................... B32B 3/08 |

\* cited by examiner

NON-LIGHT-EMITTING VARIABLE TRANSMISSION DEVICE AND A LIGHT-EMITTING DEVICE ASSEMBLY AND A METHOD OF USING THE SAME

CROSS-REFERENCE TO RELATED APPLICATION(S)

This application claims priority under 35 U.S.C § 119(e) to U.S. Provisional Application No. 62/926,903, entitled "NON-LIGHT-EMITTING VARIABLE TRANSMISSION DEVICE AND A LIGHT-EMITTING DEVICE ASSEMBLY AND A METHOD OF USING THE SAME," by Cody VanDerVeen et al., filed Oct. 28, 2019, which is assigned to the current assignee hereof and is incorporated herein by reference in its entirety.

FIELD OF THE DISCLOSURE

The present disclosure is directed to systems that include non-light-emitting variable transmission devices, and more specifically to an assembly that includes an electrochromic device and a polychromatic lighting device and methods of using the same.

BACKGROUND

A light-emitting diode emits light in response to an electric current while a non-light-emitting variable transmission device contains material that changes color in response to an applied voltage. While one device emits light, the second device can block light. A light-emitting diode device is used to create digital displays by emitting visible light without the use of a backlight while the non-light-emitting variable transmission device can be used to transmit near infrared light while reducing glare and the amount of sunlight entering a room or building. Advances in non-light-emitting variable transmission devices show improvements in vehicles and windows while advances in light-emitting diode devices show improvements in resolution and display sizes for television screens computer monitors, or smartphones.

However, the capabilities of light-emitting diodes, while better than liquid crystal displays, still experience glare problems as sunlight shines upon them. As such, a need exists for better glare control in light-emitting diode devices while maintaining a high contrast ratio and resolution capacity.

BRIEF DESCRIPTION OF THE DRAWING(S)

Embodiments are illustrated by way of example and are not limited in the accompanying figures.

FIG. 1 includes a representative cross-sectional view of an insulated glass unit (IGU) including a non-light-emitting, variable transmission device, according to one embodiment.

Figure 2:
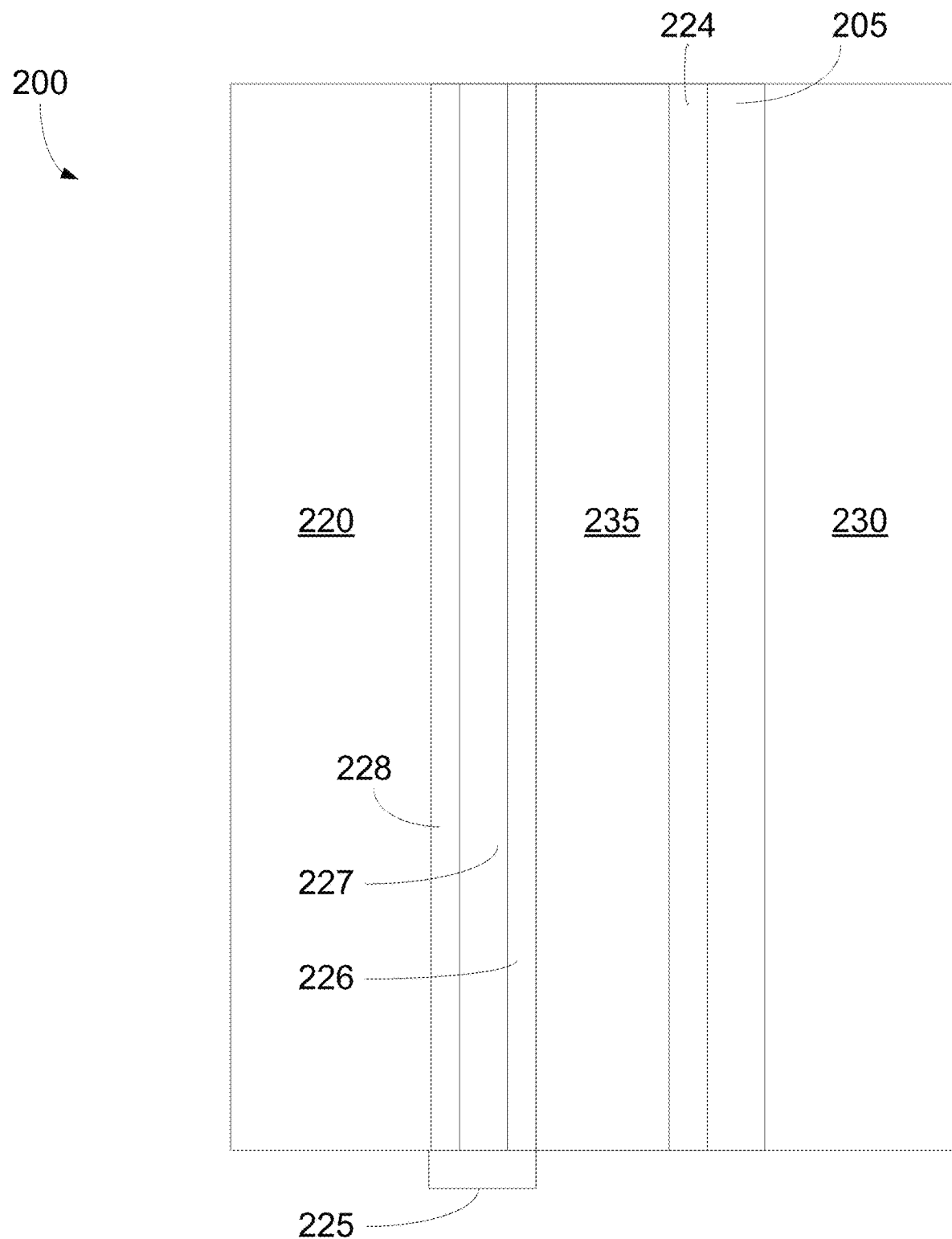

FIG. 2 includes an illustration of an assembly that can include a non-light-emitting, variable transmission device, according to another embodiment.

Figure 3A:
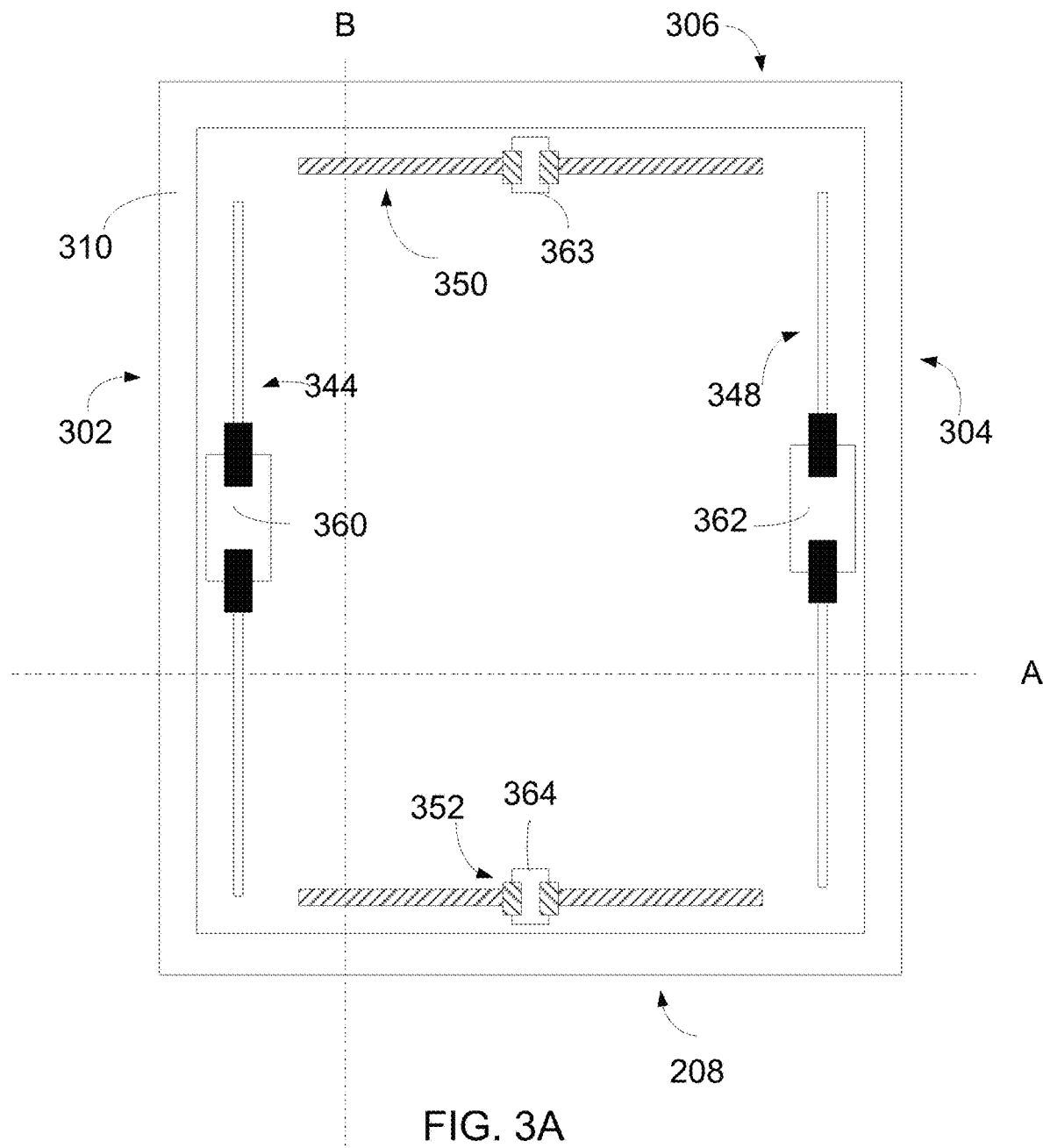

FIG. 3A includes an illustration of a top view of the substrate, the stack of layers, and the bus bars.

Figure 3B:
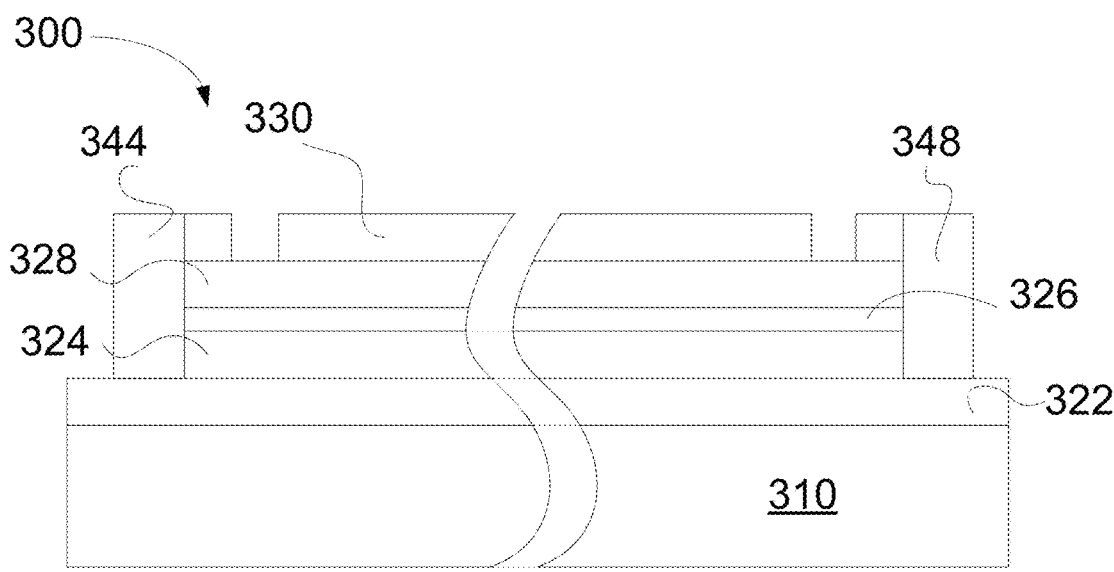

FIG. 3B includes an illustration of a cross-sectional view along line A of a portion of a substrate, a stack of layers for an electrochromic device, and bus bars, according to one embodiment.

Figure 3C:
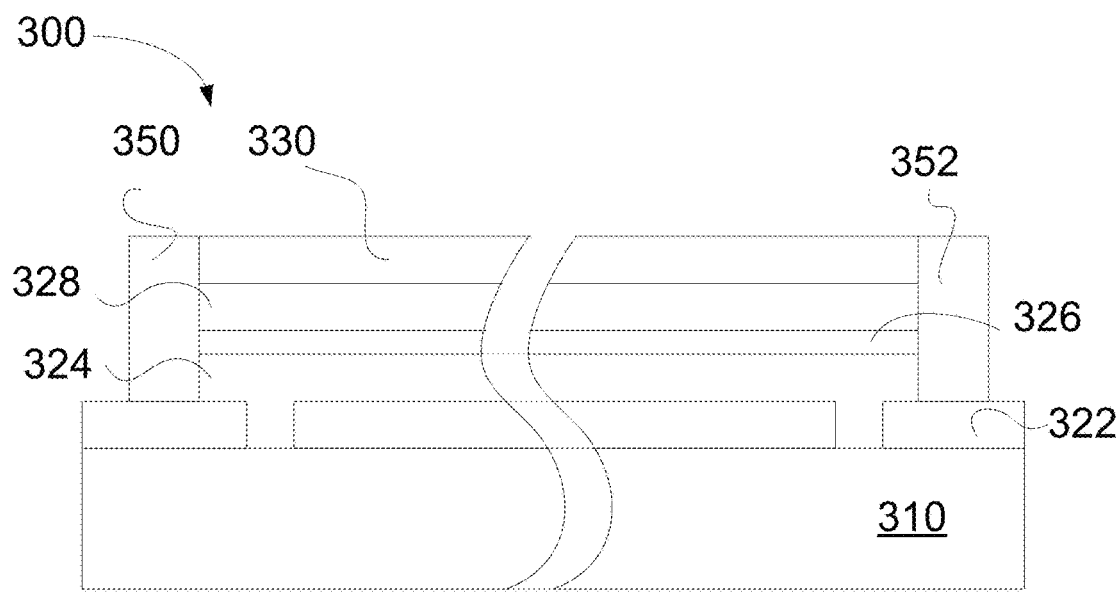

FIG. 3C includes an illustration of a cross-sectional view along line B of a portion of a substrate, a stack of layers for an electrochromic device, and bus bars, according to one embodiment.

Figure 4A:
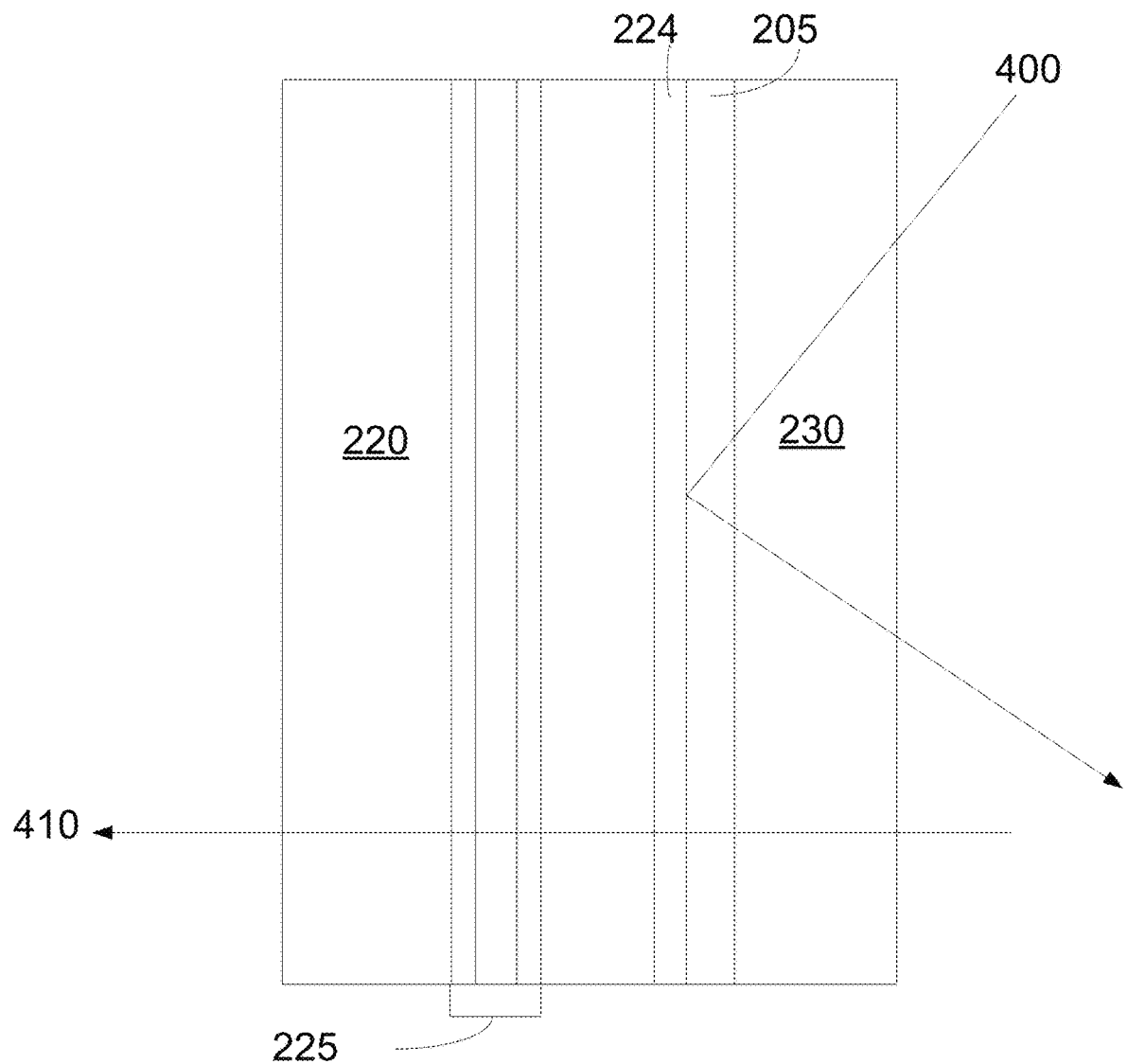

FIG. 4A includes an illustration of the pathway of transmission of both a non-light-emitting, variable transmission device and a light-emitting device, according to one embodiment.

Figure 4B:
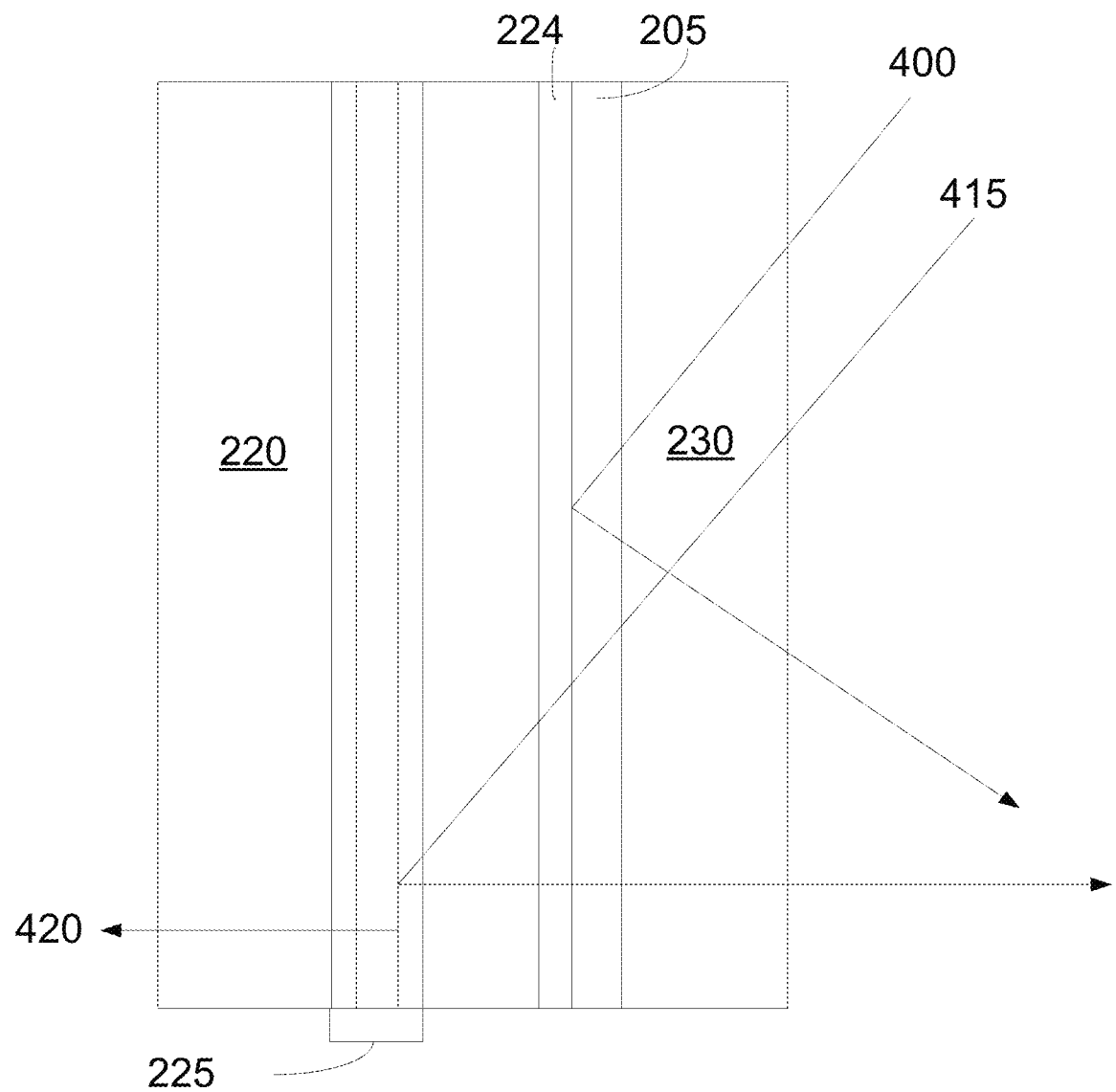

FIG. 4B includes an illustration of the pathway of transmission of both a non-light-emitting, variable transmission device and a light-emitting device, according to another embodiment.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings.

As used herein, the terms "comprises," "comprising," "includes," "including," "has," "having," or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

The use of "a" or "an" is employed to describe elements and components described herein. This is done merely for convenience and to give a general sense of the scope of the invention. This description should be read to include one or at least one and the singular also includes the plural, or vice versa, unless it is clear that it is meant otherwise.

The use of the word "about," "approximately," or "substantially" is intended to mean that a value of a parameter is close to a stated value or position. However, minor differences may prevent the values or positions from being exactly as stated. Thus, differences of up to ten percent (10%) for the value are reasonable differences from the ideal goal of exactly as described.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the glass, vapor deposition, and electrochromic arts.

An assembly can include a non-light-emitting, variable transmission device, and a light-emitting device where the light-emitting diode device is configured to transmit a signal and where the non-light-emitting, variable transmission device alters the intensity of the transmitted signal from the light-emitting device.

The systems and methods are better understood after reading the specification in conjunction with the figures. System architectures are described and illustrated, followed by an exemplary construction of a non-light-emitting, variable transmission device, and a method of controlling the system. The embodiments described are illustrative and not meant to limit the scope of the present invention, as defined by the appended claims.

Referring to FIG. 1, an assembly 100 that can include a non-light-emitting, variable transmission device 124 is illustrated and is generally designated 100. In one embodiment, the non-light-emitting, variable transmission device 124 can be an electrochromic device, such as the device described in more detail below. As depicted, the assembly 100 can be an insulated glazing unit (IGU). The assembly 100 can include a counter substrate 120 and a solar control film 112 disposed between a substrate 105 of the non-light-emitting, variable transmission device 124 and the counter substrate 120. In one embodiment, the counter substrate 120 can be a support lite and the substrate 105 can be an electrochromic lite. The counter substrate 120 can be coupled to a pane 130. Each of the counter substrate 120 and pane 130 can be a glass panel, a sapphire panel, an aluminum oxynitride panel, or a spinel panel. In another implementation, the second panel can include a transparent polymer, such as a polyacrylic compound, a polyalkene, a polycarbonate, a polyester, a polyether, a polyethylene, a polyimide, a polysulfone, a polysulfide, a polyurethane, a polyvinylacetate, another suitable transparent polymer, or a co-polymer of the foregoing. The second panel may or may not be flexible. In a particular implementation, each of the counter substrate 120 and pane 130 can be float glass or a borosilicate glass and have a thickness in a range of 5 mm to 30 mm thick. Each of the counter substrate 120 and pane 130 can be a heat-treated, heat-strengthened, or tempered panel. In one embodiment, the assembly 100 can further include a medium layer with a refractive index approximately equal to a refractive index of either the counter substrate 120 or the panel 130.

A low-emissivity layer 132 can be disposed along an inner surface of the pane 130. The low-emissivity layer 132 and the non-light-emitting, variable transmission device 124 can be spaced apart by a spacer 142. The spacer 142 can be coupled to the substrate 105 and low-emissivity layer 132 via seals 144. The seals 144 can be a polymer, such as polyisobutylene.

An internal space 160 of the assembly 100 may include a relatively inert gas, such as a noble gas or dry air. In another embodiment, the internal space 160 may be evacuated. The assembly 100 can include an energy source, a control device, and an input/output (I/O) unit. The energy source can provide energy to the non-light-emitting, variable transmission device 124 via the control device. In an embodiment, the energy source may include a photovoltaic cell, a battery, another suitable energy source, or any combination thereof. The control device can be coupled to the non-light-emitting, variable transmission device 124 and the energy source. The control device can include logic to control the operation of the non-light-emitting, variable transmission device 124. The logic for the control device can be in the form of hardware, software, or firmware. In an embodiment, the logic may be stored in a field programmable gate array (FPGA), an application-specific integrated circuit (ASIC), or another persistent memory. In an embodiment, the control device may include a processor that can execute instructions stored in memory within the control device or received from an external source. The I/O unit can be coupled to the control device. The I/O unit can provide information from sensors, such as light, motion, temperature, another suitable parameter, or any combination thereof. The I/O unit may provide information regarding the non-light-emitting, variable transmission device 124, the energy source, or control device to another portion of the apparatus or to another destination outside the apparatus.

In a particular embodiment, the assembly 100 can include a light-emitting device 125. The light-emitting device 125 can be coupled to the pane 130 and spaced apart from the non-light-emitting, variable transmission device 124 by the spacer 142. In another embodiment, such as seen in FIG. 2, the light-emitting device 125 can be laminated to the non-light-emitting, variable transmission device 124. In one embodiment, the light-emitting device 125 can face the non-light-emitting, variable transmission device 124. In one embodiment, the internal space 160 can be between the light-emitting device 125 and the non-light-emitting, variable transmission device 124. In one embodiment, the light-emitting device can be a light-emitting diode (LED) device. In another embodiment, the light-emitting device can be selected from the group consisting of an organic light-emitting diode (OLED), polymer light-emitting diode (PLED), liquid crystal display (LCD), and a transparent organic light-emitting diode (TOLED). In one embodiment, the light-emitting device can include an anode layer 126, a cathode layer 128, and at least one organic material layer 127 disposed between the anode layer 126 and the cathode layer 128. In one particular embodiment, the light-emitting device 125 can include a transparent anode layer, a transparent cathode layer, a hole transport layer, an emissive layer, an electron transport layer, an electron injection layer, and a transparent substrate. The transparent anode layer and transparent cathode layer may be formed from transparent conductive material selected from the group consisting of indium tin oxide, indium zinc oxide, silver, and aluminum. In one embodiment, the TOLED device can have a transparency of greater than or equal to 1%, such as about greater than or equal to 3%, greater than or equal to 8%, greater than or equal to 10%, greater than or equal to 15%, or greater than or equal to 20%. In an embodiment including an LCD device, the LCD can be a transparent LCD. In one embodiment, the transparent LCD device can include a backlight, such as an electroluminescent (EL) film. In another embodiment, the transparent LCD device does not include a backlight but instead utilizes ambient light, from for example the sun, as a light source. In such an embodiment, the non-light-emitting, variable transmission device can be disposed such that it does not overlap with the LCD device but can be instead disposed around the edges of the LCD device. In other words, while the LCD device is on a separate substrate, when viewed from the front, the non-light-emitting, variable transmission device would be surrounding the LCD device. In yet another embodiment, a light source can be included around the edge of the LCD device. In yet another embodiment, a diffusion screen can be included to diffuse light from a light source. The light source can be disposed around the perimeter of the device or can shine directly through the transparent device. The diffusion screen can reflect light from either side of the assembly to serve as the light source for the LCD device.

FIG. 2 includes an assembly 200 with a non-light-emitting, variable transmission device, according to another embodiment. The assembly 200 can include the non-light-emitting, variable transmission device 224, light-transmitting device 225, pane 220, pane 230, and laminate layer 235. In one embodiment, the laminate layer 235 is an insulating layer that provides protection and electrical separation between the non-light-emitting, variable transmission device 224 and the light-emitting device 225. The non-light-emitting, variable transmission device 224 can be deposited on a substrate 205. In one embodiment, non-light-emitting, variable transmission device 224 can be the device described below in FIGS. 3A-3C. The light-transmitting device 225 can include an anode layer 226, a cathode layer 228, and at least one organic material layer 227 disposed between the anode layer 226 and the cathode layer 228. The light-transmitting device 225 can be similar to the light-transmitting device 125 described above.

The laminate layer 235 can include material selected from the group consisting of acrylics, methacrylics, polymethylmethacrylate, polyhexylacrylate, polyvinylidene fluoride, polyvinyl acetate, polyvinylbutyral (PVB), polyurethane, epoxy, silicone, polysulfide, polyethylene oxide, polypropylene oxide, and polyvinyl alcohol. In one embodiment, the non-light-emitting variable transmission device 224 can be deposited on the pane 230, the light-transmitting device 225 can be deposited onto the pane 220, and then the two panes can be laminated together. Once the panes have been laminated together, the panes may be subjected to radiation and/or heat treatment to further polymerize and or crosslink the lamination layer.

The assembly 100 can provide controlled output for a light-emitting device coupled to a non-light-emitting, variable transmission device, as further described below in FIGS. 4A and 4B. With respect to a configuration, the assembly 100/200 can include a logic element, e.g., coupled to the assembly that can perform the method steps described below. In particular, the logic element can be configured to send commands to control the various non-light emitting, variable transmission devices. For example, the controller can regulate the voltage being transmitted to the non-light-emitting, variable transmission devices in response to a tint or clear command.

The system can be used with a wide variety of different types of non-light-emitting variable transmission devices. The apparatuses and methods can be implemented with switchable devices that affect the transmission of light through a window. Much of the description below addresses embodiments in which the switchable devices are electrochromic devices. In other embodiments, the switchable devices can include suspended particle devices, liquid crystal devices that can include dichroic dye technology, and the like. Thus, the concepts as described herein can be extended to a variety of switchable devices used with windows.

The description with respect to FIGS. 3A-3C provide exemplary embodiments of a glazing that includes a glass substrate and a non-light-emitting variable transmission device disposed thereon. The embodiment as described with respect to FIGS. 3A-3C is not meant to limit the scope of the concepts as described herein. In the description below, a non-light-emitting variable transmission device will be described as operating with voltages on bus bars being in a range of 0V to 3V. Such description is used to simplify concepts as described herein. Other voltage may be used with the non-light-emitting variable transmission device or if the composition or thicknesses of layers within an electrochromic stack are changed. The voltages on bus bars may both be positive (1V to 4V), both negative (−5V to −2V), or a combination of negative and positive voltages (−1V to 2V), as the voltage difference between bus bars are more important than the actual voltages. Furthermore, the voltage difference between the bus bars may be less than or greater than 3V. After reading this specification, skilled artisans will be able to determine voltage differences for different operating modes to meet the needs or desires for a particular application. The embodiments are exemplary and not intended to limit the scope of the appended claims.

FIG. 3A an illustration of a top view of a substrate 310, a stack of layers of an electrochromic device 322, 324, 326, 328, and 330, and bus bars 344, 348, 350, and 352 overlying the substrate 300, according to one embodiment. In an embodiment, the substrate 310 can include a glass substrate, a sapphire substrate, an aluminum oxynitride substrate, or a spinel substrate. In another embodiment, the substrate 310 can include a transparent polymer, such as a polyacrylic compound, a polyalkene, a polycarbonate, a polyester, a polyether, a polyethylene, a polyimide, a polysulfone, a polysulfide, a polyurethane, a polyvinylacetate, another suitable transparent polymer, or a co-polymer of the foregoing. The substrate 310 may or may not be flexible. In a particular embodiment, the substrate 310 can be float glass or a borosilicate glass and have a thickness in a range of 0.5 mm to 4 mm thick. In another particular embodiment, the substrate 310 can include ultra-thin glass that is a mineral glass having a thickness in a range of 50 microns to 300 microns. In a particular embodiment, the substrate 310 may be used for many different non-light-emitting variable transmission devices being formed and may referred to as a motherboard.

The bus bar 344 lies along a side 302 of the substrate 310 and the bus bar 348 lies along a side 304 that is opposite the side 302. The bus bar 350 lies along side 306 of the substrate 310, and the bus bar 352 lies along side 308 that is opposite side 306. Each of the bus bars 344, 348, 350, and 352 has lengths that extend a majority of the distance each side of the substrate. In a particular embodiment, each of the bus bars 344, 348, 350, and 352 have a length that is at least 75%, at least 90%, or at least 95% of the distance between the sides 302, 304, 306, and 308 respectively. The lengths of the bus bars 344 and 348 are substantially parallel to each other. As used herein, substantially parallel is intended to means that the lengths of the bus bars 344 and 348, 350 and 352 are within 10 degrees of being parallel to each other. Along the length, each of the bus bars has a substantially uniform cross-sectional area and composition. Thus, in such an embodiment, the bus bars 344, 348, 350, and 352 have a substantially constant resistance per unit length along their respective lengths.

In one embodiment, the bus bar 344 can be connected to a first voltage supply terminal 360, the bus bar 348 can be connected to a second voltage supply terminal 362, the bus bar 350 can be connected to a third voltage supply terminal 363, and the bus bar 352 can be connected to a fourth voltage supply terminal 364. In one embodiment, the voltage supply terminals can be connected to each bus bar 344, 348, 350, and 352 about the center of each bus bar. In one embodiment, each bus bar 344, 348, 350, and 352 can have one voltage supply terminal. The ability to control each voltage supply terminal 360, 362, 363, and 364 provide for control over grading of light transmission through the electrochromic device 124.

In one embodiment, the first voltage supply terminal 360 can set the voltage for the bus bar 344 at a value less than the voltage set by the voltage supply terminal 363 for the bus bar 350. In another embodiment, the voltage supply terminal 363 can set the voltage for the bus bar 350 at a value greater than the voltage set by the voltage supply terminal 364 for the bus bar 352. In another embodiment, the voltage supply terminal 363 can set the voltage for the bus bar 350 at a value less than the voltage set by the voltage supply terminal 364 for the fourth bus bar 352. In another embodiment, the voltage supply terminal 360 can set the voltage for the bus bar 344 at a value about equal to the voltage set by the voltage supply terminal 362 for the bus bar 348. In one embodiment, the voltage supply terminal 360 can set the voltage for the bus bar 344 at a value within about 0.5V, such as 0.4V, such as 0.3V, such as 0.2V, such as 0.1V to the voltage set by the voltage supply terminal 362 for the second bus bar 348. In a non-limiting example, the first voltage supply terminal 360 can set the voltage for the bus bar 344 at 0V, the second voltage supply terminal 362 can set the voltage for the bus bar 348 at 0V, the third voltage supply terminal 363 can set the voltage for the bus bar 350 at 3V, and the fourth voltage supply terminal 364 can set the voltage for the bus bar 352 at 1.5V.

The compositions and thicknesses of the layers are described with respect to FIGS. 3B and 3C. Transparent conductive layers 322 and 330 can include a conductive metal oxide or a conductive polymer. Examples can include a tin oxide or a zinc oxide, either of which can be doped with a trivalent element, such as Al, Ga, In, or the like, a fluorinated tin oxide, or a sulfonated polymer, such as polyaniline, polypyrrole, poly(3,4-ethylenedioxythiophene), or the like. In another embodiment, the transparent conductive layers 322 and 330 can include gold, silver, copper, nickel, aluminum, or any combination thereof. The transparent conductive layers 322 and 330 can have the same or different compositions.

The set of layers further includes an electrochromic stack that includes the layers 324, 326, and 328 that are disposed between the transparent conductive layers 322 and 330. The layers 324 and 328 are electrode layers, wherein one of the layers is an electrochromic layer, and the other of the layers is an ion storage layer (also referred to as a counter electrode layer). The electrochromic layer can include an inorganic metal oxide electrochemically active material, such as $WO_3$, $V_2O_5$, $MoO_3$, $Nb_2O_5$, $TiO_2$, $CuO$, $Ir_2O_3$, $Cr_2O_3$, $Co_2O_3$, $Mn_2O_3$, or any combination thereof and have a thickness in a range of 50 nm to 2000 nm. The ion storage layer can include any of the materials listed with respect to the electrochromic layer or $Ta_2O_5$, $ZrO_2$, $HfO_2$, $Sb_2O_3$, or any combination thereof, and may further include nickel oxide (NiO, $Ni_2O_3$, or combination of the two), and Li, Na, H, or another ion and have a thickness in a range of 80 nm to 500 nm. An ion conductive layer 326 (also referred to as an electrolyte layer) is disposed between the electrode layers 324 and 328, and has a thickness in a range of 20 microns to 60 microns. The ion conductive layer 326 allows ions to migrate there through and does not allow a significant number of electrons to pass there through. The ion conductive layer 326 can include a silicate with or without lithium, aluminum, zirconium, phosphorus, boron; a borate with or without lithium; a tantalum oxide with or without lithium; a lanthanide-based material with or without lithium; another lithium-based ceramic material; or the like. The ion conductive layer 326 is optional and, when present, may be formed by deposition or, after depositing the other layers, reacting portions of two different layers, such as the electrode layers 324 and 328, to form the ion conductive layer 326. After reading this specification, skilled artisans will appreciate that other compositions and thicknesses for the layers 322, 324, 326, 328, and 330 can be used without departing from the scope of the concepts described herein.

The layers 322, 324, 326, 328, and 330 can be formed over the substrate 210 with or without any intervening patterning steps, breaking vacuum, or exposing an intermediate layer to air before all the layers are formed. In an embodiment, the layers 322, 324, 326, 328, and 330 can be serially deposited. The layers 322, 324, 326, 328, and 330 may be formed using physical vapor deposition or chemical vapor deposition. In a particular embodiment, the layers 322, 324, 326, 328, and 330 are sputter deposited.

In the embodiment illustrated in FIGS. 3B and 3C, each of the transparent conductive layers 322 and 330 include portions removed, so that the bus bars 344/348 and 350/352 are not electrically connected to each other. Such removed portions are typically 20 nm to 2000 nm wide. In a particular embodiment, the bus bars 344 and 348 are electrically connected to the electrode layer 324 via the transparent conductive layer 322, and the bus bars 350 and 352 are electrically connected to the electrode layer 328 via the transparent conductive layer 330. The bus bars 344, 348, 350, and 352 include a conductive material. In an embodiment, each of the bus bars 344, 348, 350, and 352 can be formed using a conductive ink, such as a silver frit, that is printed over the transparent conductive layer 322. In another embodiment, one or both of the bus bars 344, 348, 350, and 352 can include a metal-filled polymer. In a particular embodiment (not illustrated), the bus bars 350 and 352 are each a non-penetrating bus bar that can include the metal-filled polymer that is over the transparent conductive layer 330 and spaced apart from the layers 322, 324, 326, and 328. The viscosity of the precursor for the metal-filled polymer may be sufficiently high enough to keep the precursor from flowing through cracks or other microscopic defects in the underlying layers that might be otherwise problematic for the conductive ink. The lower transparent conductive layer 322 does not need to be patterned in this particular embodiment. In one embodiment, bus bars 344 and 348 are opposed each other. In one embodiment, bus bars 350 and 352 are orthogonal to bus bar 344.

In the embodiment illustrated, the width of the non-light-emitting variable transmission device $W_{EC}$ is a dimension that corresponds to the lateral distance between the removed portions of the transparent conductive layers 322 and 330. $W_S$ is the width of the stack between the bus bars 344 and 348. The difference in $W_S$ and $W_{EC}$ is at most 5 cm, at most 2 cm, or at most 0.9 cm. Thus, most of the width of the stack corresponds to the operational part of the non-light-emitting variable transmission device that allows for different transmission states. In an embodiment, such operational part is the main body of the non-light-emitting variable transmission device and can occupy at least 90%, at least 95%, at least 98% or more of the area between the bus bars 344 and 348.

Attention is now addressed to installing, configuring, and using the assembly as illustrated in FIG. 1 with glazings and non-light-emitting, variable transmission devices that can be similar to the glazing and non-light-emitting, variable transmission device as illustrated and described with respect to FIGS. 3A-3C. In another embodiment, other designs of glazings and non-light-emitting, variable transmission devices can be used.

FIG. 4A includes an illustration of the operation of an assembly, such as assembly 100. The assembly includes both an non-light-emitting, variable transmission device 224 and a light-emitting device 225, such as a transparent light-emitting device. FIG. 4A shows the pathway of transmission of both the non-light-emitting, variable transmission device 224 and the light-emitting device 225 when the non-light-emitting, variable transmission device 224 is on and the light-emitting device 225 is off. As current flows through non-light-emitting, variable transmission device 224 to change the state of the device 224 from clear to tint, certain wavelengths (such as sun rays) can be reflected from the non-light-emitting, variable transmission device 224 as seen by the pathway 400. Since the light-emitting device 225 is turned off, the light-emitting device 225 allows transmission through the transparent device as seen by the transmission pathway 410. In one embodiment, the transmission of the light-emitting device 225 can be greater than or equal to 3%, such as greater than 5%, greater than 8%, greater than 10%, greater than 15%, or greater than 20%. As such, the culmination of the transmittance of the assembly would yield a transmission of about between 3% to 15%. As such, to an observer, the assembly would appear tinted or colored while still being able to see through the window.

FIG. 4B shows the pathway of transmission of both the non-light-emitting, variable transmission device 224 and the light-emitting device 225 when both the non-light-emitting, variable transmission device 224 is and the light-emitting device 225 are on. As current flows through non-light-emitting, variable transmission device 224 to change the state of the device 224 from clear to tint, certain wavelengths (such as sun rays) can be reflected from the non-light-emitting, variable transmission device 224 as seen by the pathway 400. As the light-emitting device 225 is turned on, the light-emitting device has an emission pathway 420 that emits an image and a transmission pathway 415 that blocks transmission through the transparent device. In one embodiment, the transmission of the light-emitting device 225 can be less than or equal to 3%, such as less than 2%, or less than 1%. As such, the culmination of the transmittance of the non-light-emitting, variable transmission device 224 and the light-emitting device 225 would yield a transmission of about between 1% to 3%. To an observer, the assembly would appear to emit an image and would no longer permit an observer to see through the window. The culmination of the image projected from the light-emitting device 225 and the radiation deflected from the non-light-emitting, variable transmission device 224 would enhance the image quality being projected. In other words, the non-light-emitting, variable transmission device 224 reduces the background light surrounding the light-emitting device 225. The non-light-emitting, variable transmission device 224 advantageously reduces the glare from ambient light that would otherwise affect the emission of the light-emitting device 225. As such, an observer would be able to more clearly see the image being projected from the light-emitting device 225.

In another embodiment, the both the non-light-emitting, variable transmission device 224 and the light-emitting device 225 can be turned off. As such, the non-light-emitting, variable transmission device 224 can be in a full clear state such as to permit at least 80% transmittance, such as at least 50% transmittance, at least 85% transmittance, at least 90% transmittance, or at least 95% transmittance. Since the light-emitting device 225 is also turned off, the light-emitting device 225 can allow transmission through the transparent device. In one embodiment, the transmission of the light-emitting device 225 can be greater than or equal to 3%, such as greater than 5%, greater than 8%, greater than 10%, greater than 15%, or greater than 20%. As such, the culmination of the transmittance of the assembly would yield a transmission of about between 80% to 98%. As such, to an observer, the assembly would appear clear without indication that emission is possible.

The assembly 100/200 can be coupled to a logic element to control the operation of building environmental and facility controls, such as heating, ventilation, and air conditioning (HVAC), lights, scenes for the non-light-emitting, variable transmission device, including the device 300, and the light-transmitting device. The logic can be in the form of hardware, software, or firmware. In an embodiment, the logic may be stored in a field programmable gate array (FPGA), an application-specific integrated circuit (ASIC), a hard drive, a solid state drive, or another persistent memory. In an embodiment, the assembly may be coupled to a processor that can execute instructions stored in memory within a control management system or received from an external source to operate both the non-light-emitting, variable transmission device and the light-emitting device.

Embodiments as described above can provide benefits over other systems with non-light-emitting, variable transmission devices. The use of a non-light-emitting, variable transmission device to regulate the output of a light-emitting device can enhance the clarity of the transmission of the light-emitting device by regulating the glare or reflectance of ambient light.

Many different embodiments and embodiments are possible. Some of those embodiments and embodiments are described below. After reading this specification, skilled artisans will appreciate that those embodiments and embodiments are only illustrative and do not limit the scope of the present invention. Exemplary embodiments may be in accordance with any one or more of the ones as listed below.

Embodiment 1. An assembly can include a first substrate, a second substrate, a non-light emitting, variable transmission device deposited on the first substrate, and a transparent light-emitting device deposited on the second substrate, wherein the non-light-emitting, variable transmission device faces the transparent light-emitting device, and where the non-light emitting device alters an intensity of a wavelength prior to reaching the transparent light-emitting device.

Embodiment 2. A window assembly can include a first substrate, a second substrate, a non-light-emitting, variable transmission device deposited on the first substrate, where the non-light-emitting, variable transmission device alters between a first state and a second state, where the first state has a transmittance of less than 10% and where the second state has a transmittance of at least 50%, and a transparent light-emitting device deposited on the second substrate, where the transparent light-emitting device alters between a third state and a fourth state, where the third state is emittive and the fourth state is transmittive, where the non-light emitting device alters a wavelength prior to reaching the transparent light-emitting device, and where the assembly alters between a fifth state and a sixth state, wherein the fifth state has a transmittance of less than 5% and the sixth state has a transmittance of at least 20%.

Embodiment 3. The assembly of any one of embodiments 1 or 2, where the non-light-emitting, variable transmission device is an electrochromic device.

Embodiment 4. The assembly of any one of embodiments 1 or 2, where the transparent light emitting device is a transparent organic light-emitting diode device.

Embodiment 5. The assembly of any one of embodiments 1 or 2, can further include a spacer between the first substrate and the second substrate.

Embodiment 6. The assembly of any one of embodiments 1 or 2, can further include an electrically insulating layer between the non-light emitting, variable transmission device and the transparent light-emitting device.

Embodiment 7. The assembly of embodiment 3, where the electrochromic device can include a first transparent conductive layer, a second transparent conductive layer, an electrochromic layer disposed between the first transparent conductive layer and the second transparent conductive layer, and an ion storage layer disposed between the first transparent conductive layer and the second transparent conductive layer.

Embodiment 8. The assembly of embodiment 4, where the transparent organic light-emitting diode device can include a transparent anode layer, a transparent cathode layer, and at least one organic material layer disposed between the transparent anode layer and the transparent cathode layer.

Embodiment 9. The assembly of embodiment 8, where the at least one organic material layer can include a hole transport layer, an emissive layer, an electron transport layer, and an electron injection layer.

Embodiment 10. The assembly of any one of embodiments 1 or 2, can further include a medium, where the medium has a refractive index approximately equal to either a refractive index of the first substrate or a refractive index of the second substrate.

Note that not all of the activities described above in the general description or the examples are required, that a portion of a specific activity may not be required, and that one or more further activities may be performed in addition to those described. Still further, the order in which activities are listed is not necessarily the order in which they are performed.

Certain features that are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes each and every value within that range.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An assembly, comprising:
    a first substrate;
    a second substrate;
    a non-light-emitting, variable transmission device deposited on the first substrate; and
    a transparent light-emitting device deposited on the second substrate, wherein the non-light-emitting, variable transmission device faces the transparent light-emitting device, and wherein the non-light emitting device alters an intensity of a wavelength prior to reaching the transparent light-emitting device, wherein a difference of a lateral width between removed portions of transparent conductive layers $W_{EC}$ and a width between bus bars $W_S$ of the non-light-emitting variable transmission device is at 5 cm.

2. The assembly of claim 1, wherein the non-light-emitting, variable transmission device is an electrochromic device.

3. The assembly of claim 2, wherein the electrochromic device comprises:
    a first transparent conductive layer;
    a second transparent conductive layer;
    an electrochromic layer disposed between the first transparent conductive layer and the second transparent conductive layer; and
    an ion storage layer disposed between the first transparent conductive layer and the second transparent conductive layer.

4. The assembly of claim 3, wherein the transparent organic light-emitting diode device comprises:
    a transparent anode layer;
    a transparent cathode layer; and
    at least one organic material layer disposed between the transparent anode layer and the transparent cathode layer.

5. The assembly of claim 1, wherein the transparent light emitting device is a transparent organic light-emitting diode device.

6. The assembly of claim 1, wherein the difference in $W_S$ and $W_{EC}$ is at most 2 cm.

7. The assembly of claim 1, further comprising an electrically insulating layer between the non-light emitting, variable transmission device and the transparent light-emitting device.

8. The assembly of claim 1, further comprising a medium, wherein the medium has a refractive index approximately equal to either a refractive index of the first substrate or a refractive index of the second substrate.

9. A window assembly, comprising:
    a first substrate;
    a second substrate;
    a non-light-emitting, variable transmission device deposited on the first substrate,
        wherein the non-light-emitting, variable transmission device alters between a first state and a second state, wherein the first state has a transmittance of less than 10% and wherein the second state has a transmittance of at least 50%; and
    a transparent light-emitting device deposited on the second substrate, wherein the transparent light-emitting device alters between a third state and a fourth state, wherein the third state is emittive and the fourth state is transmittive, wherein the non-light emitting device alters a wavelength prior to reaching the transparent light-emitting device, and wherein the assembly alters between a fifth state and a sixth state, wherein the fifth state has a transmittance of less than 5% and the sixth state has a transmittance of at least 20%.

10. The assembly of claim 9, wherein the non-light-emitting, variable transmission device is an electrochromic device.

11. The assembly of claim 10, wherein the electrochromic device comprises:
   a first transparent conductive layer;
   a second transparent conductive layer;
   an electrochromic layer disposed between the first transparent conductive layer and the second transparent conductive layer; and
   an ion storage layer disposed between the first transparent conductive layer and the second transparent conductive layer.

12. The assembly of claim 11, wherein the transparent organic light-emitting diode device comprises:
   a transparent anode layer;
   a transparent cathode layer; and
   at least one organic material layer disposed between the transparent anode layer and the transparent cathode layer.

13. The assembly of claim 12, wherein the at least one organic material layer comprises:
   a hole transport layer;
   an emissive layer;
   an electron transport layer; and
   an electron injection layer.

14. The assembly of claim 9, wherein the transparent light emitting device is a transparent organic light-emitting diode device.

15. The assembly of claim 9, further comprising a spacer between the first substrate and the second substrate.

16. The assembly of claim 9, further comprising an electrically insulating layer between the non-light emitting, variable transmission device and the transparent light-emitting device.

17. The assembly of claim 9, further comprising a medium, wherein the medium has a refractive index approximately equal to either a refractive index of the first substrate or a refractive index of the second substrate.

18. An assembly, comprising:
   a first substrate;
   a second substrate;
   an electrochromic deposited on the first substrate, wherein the electrochromic comprises;
      a first transparent conductive layer;
      a second transparent conductive layer;
      an electrochromic layer disposed between the first transparent conductive layer and the second transparent conductive layer; and
   a transparent light-emitting device deposited on the second substrate, wherein the electrochromic faces the transparent light-emitting device, and wherein the electrochromic alters an intensity of a wavelength prior to reaching the transparent light-emitting device, wherein a difference of a lateral width between removed portions of transparent conductive layers $W_{EC}$ and a width between bus bars $W_S$ of electrochromic is at most 5 cm.

19. The assembly of claim 18, wherein the transparent light-emitting device is a transparent organic light-emitting diode device comprising;
   a transparent anode layer;
   a transparent cathode layer; and
   at least one organic material layer disposed between the transparent anode layer and the transparent cathode layer.

* * * * *

UNITED STATES PATENT AND TRADEMARK OFFICE
CERTIFICATE OF CORRECTION

Page 1 of 1

PATENT NO. : 11,758,791 B2
APPLICATION NO. : 17/081542
DATED : September 12, 2023
INVENTOR(S) : Cody VanDerVeen et al.

It is certified that error appears in the above-identified patent and that said Letters Patent is hereby corrected as shown below:

In the Claims

In Column 12, Claim 1, Line 10, please delete "at 5 cm" and insert --at most 5cm--

In Column 14, Claim 19, Line 25, please delete the ";" after "comprising" and insert a --:--

Signed and Sealed this
Twenty-third Day of September, 2025

John A. Squires
*Director of the United States Patent and Trademark Office*